(12) United States Patent
Aoya

(10) Patent No.: US 7,882,625 B2
(45) Date of Patent: Feb. 8, 2011

(54) TRANSFER MASK IN MICRO BALL MOUNTER

(75) Inventor: Kengo Aoya, Beppu (JP)

(73) Assignee: Texas Instruments Incoporated, Dallas, TX (US)

( * ) Notice: Subject to any disclaimer, the term of this patent is extended or adjusted under 35 U.S.C. 154(b) by 218 days.

(21) Appl. No.: 12/033,128

(22) Filed: Feb. 19, 2008

(65) Prior Publication Data

US 2008/0196226 A1     Aug. 21, 2008

(30) Foreign Application Priority Data

Feb. 20, 2007    (JP) .............................. 2007-039224

(51) Int. Cl.
*H05K 3/30*    (2006.01)
(52) U.S. Cl. .............................. 29/832; 29/729; 29/830; 438/113
(58) Field of Classification Search .................. 29/832, 29/729, 830; 438/113; 275/693
See application file for complete search history.

(56) References Cited

U.S. PATENT DOCUMENTS

| | | | |
|---|---|---|---|
| 5,593,080 A * | 1/1997 | Teshima et al. ............... | 228/39 |
| 6,159,770 A | 12/2000 | Tetaka et al. | |
| 7,026,190 B2 * | 4/2006 | Kobayashi et al. .......... | 438/114 |
| 7,032,807 B2 * | 4/2006 | Bayot ..................... | 228/180.22 |
| 2002/0066870 A1 * | 6/2002 | Koba ....................... | 250/492.1 |
| 2006/0073675 A1 * | 4/2006 | Yamamura ................. | 438/458 |
| 2006/0086777 A1 * | 4/2006 | Itoh et al. .................... | 228/253 |

FOREIGN PATENT DOCUMENTS

| | | |
|---|---|---|
| JP | 08-335771 | 12/1996 |
| JP | 2001-332899 | 11/2001 |

* cited by examiner

*Primary Examiner*—A. Dexter Tugbang
*Assistant Examiner*—Azm Parvez
(74) *Attorney, Agent, or Firm*—Yingsheng Tung; Wade J. Brady, III; Frederick J. Telecky, Jr.

(57) ABSTRACT

The objective of this invention is to provide a transfer mask that is able to accurately pass micro-balls onto terminal areas on a substrate. A thin plate transfer mask 200 is arranged facing a substrate 100, and possesses a plurality of through-holes 242 for the purpose of passing micro-balls (solder balls) onto a plurality of terminal areas 108 formed on one surface of a substrate 100. Slits 230, 232, 234, 236 formed in the surface of the transfer mask 200 extending in the length direction and the width direction of the transfer mask 200, inside the substrate edge P1 and outside the area in which the plurality of through-holes 242 is formed when it is facing the substrate 100.

14 Claims, 8 Drawing Sheets

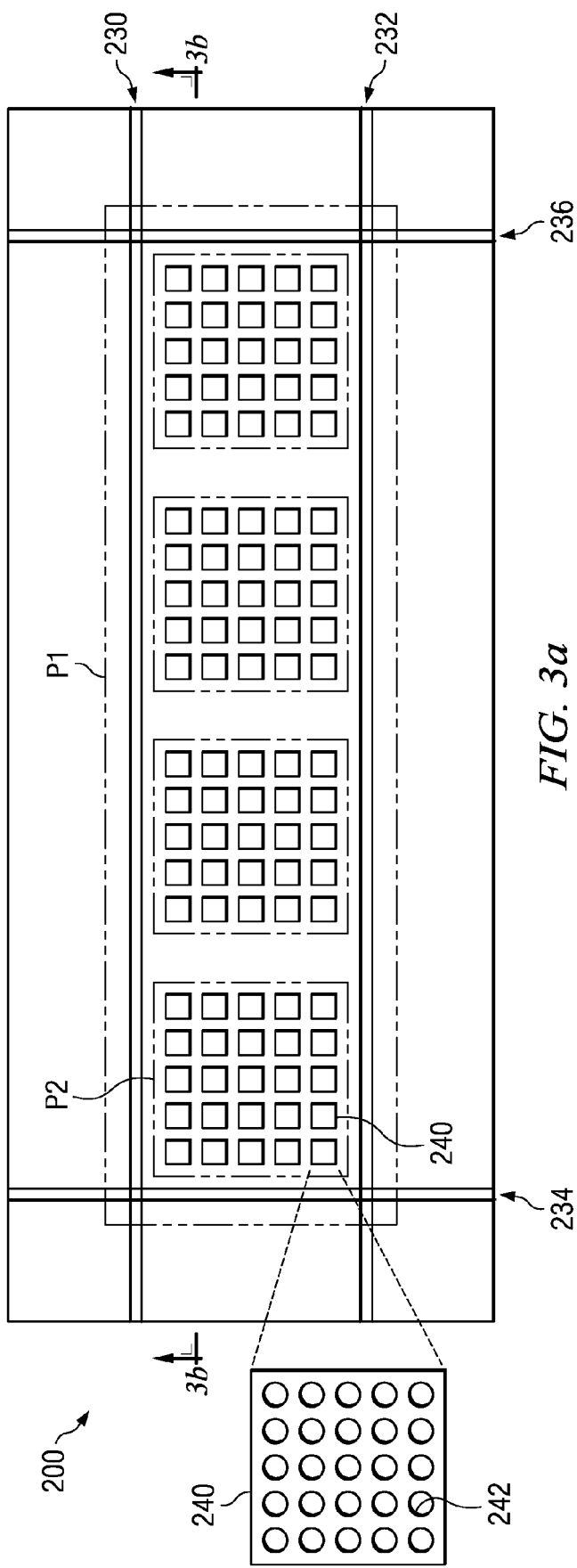
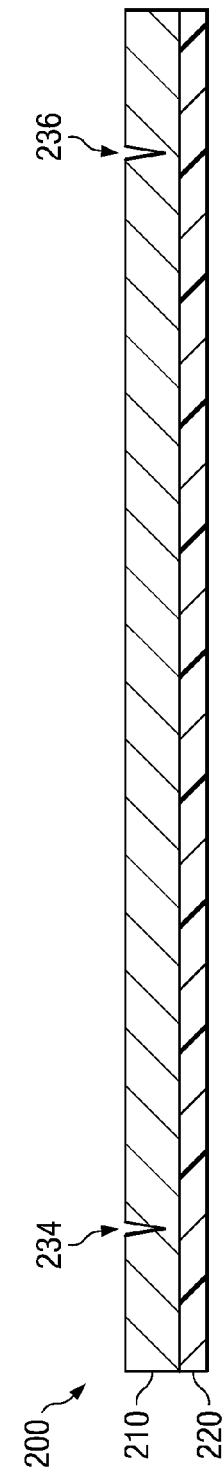
FIG. 3a
FIG. 3b

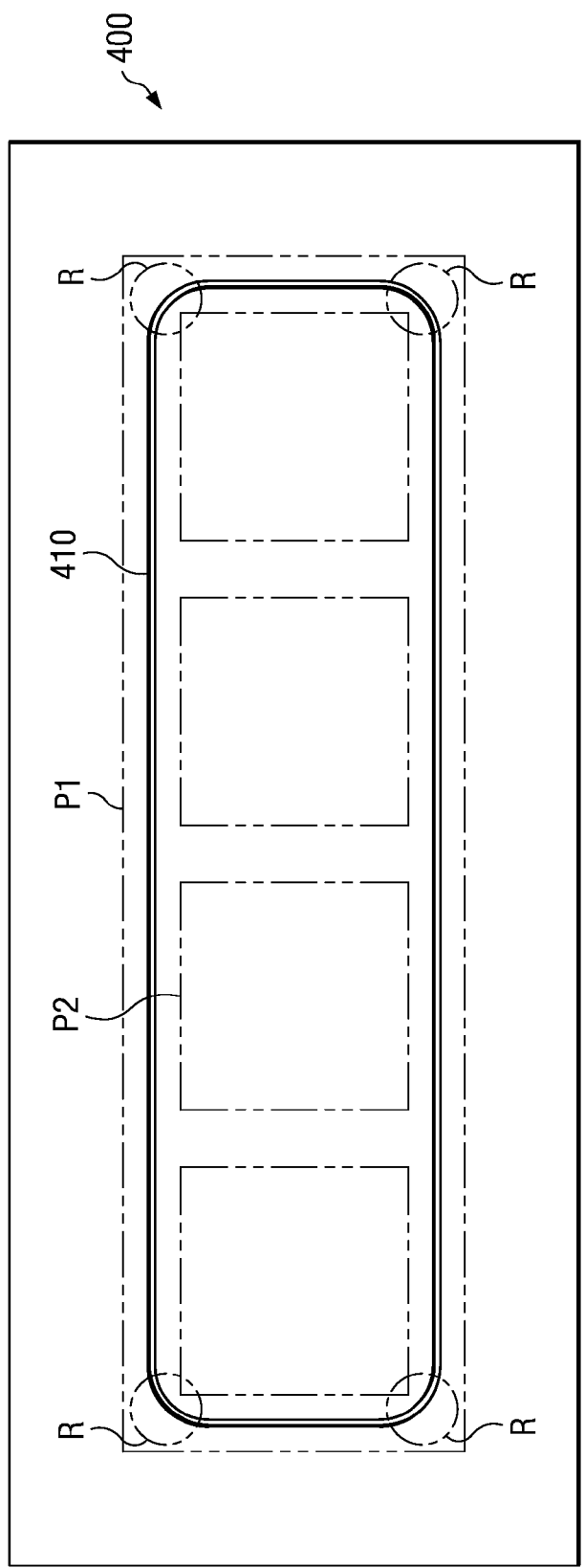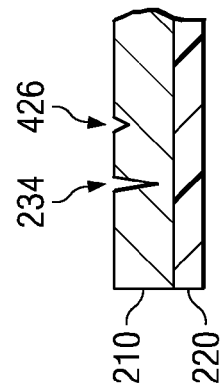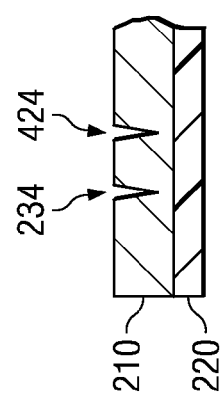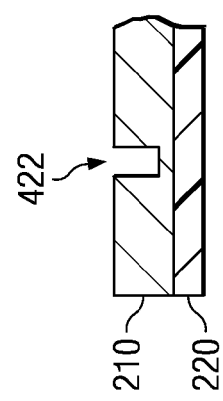
FIG. 7
FIG. 8a
FIG. 8b
FIG. 8c too great, or the gap is not constant, a plurality of micro-balls will drop into one of the through-holes in the transfer mask 28 and the micro-balls that have dropped in will not be positioned accurately in the terminal areas on the substrate 24.

In the case of surface-mount packages, such as BGA, molded resin is formed on the other surface of the substrate, and warping develops in the substrate due to the effects of thermal contraction, etc., of the molded resin. If the warping in the substrate is great, the aforementioned gap becomes to great or the gap becomes nonuniform. Therefore, in micro-ball mounting devices, the mounting surface of the substrate is mounted so that it extends somewhat beyond the surface of the backup blocks 22, with the edges of the substrate 24 pressed down by the perimeter of the transfer mask 28 to correct warping of the substrate. Furthermore, by attracting the center of the transfer mask 28 with a magnet, the transfer mask 28 and the mounting surface of the substrate 24 are drawn together so that the gap between them is constant.

FIG. 10(b) is a magnified drawing of area A at the perimeter of the transfer mask shown in FIG. 10(a). As shown in this figure, when the edge 24a of the substrate 243 is pressed down by the transfer mask 28, if the transfer mask has high tension or rigidity, the transfer mask 28 is substantially held up by reaction from the edge 24a of the substrate 24, and a larger-than-necessary gap d develops between the mounting surface 24b of the substrate and the back surface of the transfer mask in which the through-holes have been formed. If this gap d is outside the tolerance range, there will not be appropriate contact between the micro-balls that have dropped in and the terminal areas on the substrate 24, so that the micro-balls will drop from the terminal areas while the substrate is transported to the reflow soldering process, or the connection strength of the reflow-soldered micro-balls will be weak, or will cause pitch variations between the micro-balls, which causes defects and voids in the semiconductor device, and which in turn decreases yield and increases product cost.

The present invention resolves such problems of the prior art, and its purpose is to provide a mask, a semiconductor manufacturing device, and a semiconductor manufacturing method that uses said mask and that can appropriately drop ball-shaped metal terminals onto terminal areas on a substrate.

Another purpose of the present invention is to provide a mask, a semiconductor manufacturing device, and a semiconductor manufacturing method that uses the mask and that can improve the yield and decrease the production cost of surface-mount semiconductor devices such as BGA and CSP, etc.

TRANSFER MASK IN MICRO BALL MOUNTER

FIELD OF THE INVENTION

The present invention pertains to a micro-ball mounter for mounting micro-balls on surface-mount semiconductor devices, such as BGA or CSP packages, etc., and in particular pertains to a transfer mask for dropping and mounting micro-balls onto the terminal areas on a substrate.

With the increased popularity of portable telephones, portable computers, and other small electronic equipment, demand has increased for the semiconductor devices installed in them to be smaller and thinner. BGA packages and CSP packages have been developed and put into use in response to this demand.

BGA or CSP packages are surface-mount semiconductor devices, in which micro-balls are mounted as external connection terminals on one surface of the package substrate, and connections are made there. Methods of mounting these micro-balls include a method that uses a suction head and a method that employs a transfer mask.

In the former method, as shown in FIG. 9(a), a substrate 3, in which a semiconductor chip 1 has been molded in resin 2, is mounted on a stage. Flux or solder paste is formed on the terminal areas (lands) 4 of the substrate 3. Suction holes 7 are formed in a suction head 5 to vacuum-attach the micro-balls (solder balls) 6, and with the micro-balls 6 suctioned, the suction head 5 is moved toward the substrate 3, the micro-balls 6 are pressed by the suction head 5 and the micro-balls 6 are connected to the terminal areas 4. This type of micro-ball mounting method is disclosed, e.g., in Patent Citation 1 and Patent Citation 2.

In the latter method, as shown in FIG. 9(b), a transfer mask 10 is arranged facing a substrate 3. Through-holes 11 are formed in the transfer mask 10 in a pattern that is the same as the pattern of the terminal areas 4 on the substrate 3. Micro-balls 6 supplied to the transfer mask 10 are dropped into the through-holes 11 and mounted on the terminal areas 4. The micro-balls 6 and terminal areas 4 are subsequently connected by reflow soldering to form bump electrodes for external connection of the BGA or CSP package.

[Patent Citation 1] Japanese Laid-Open Patent Application No. 2001-332899
[Patent Citation 2] Japanese Laid-Open Patent Application No. Hei 8[1996]-335771

BACKGROUND OF THE INVENTION

FIG. 10(a) is a schematic drawing of a conventional micro-ball mounting device that uses a transfer mask. The micro-ball mounting device is equipped with a stage 20, on which the substrate is placed, and backup blocks 22, which are mounted on either side of the stage 20. A substrate is mounted on the stage, with its molded resin 26 facing downward so that the micro-ball mounting surface is open to the top. A transfer mask 28 is registered with the substrate 24 and its perimeter is affixed by vacuum adhesion, etc., to the backup blocks 22. In addition, a magnet is arranged inside the stage 20, so that the center of the transfer mask 28 is drawn toward the stage 20 by the magnetic force of the magnet.

When the micro-balls are dropped into place using the transfer mask 28, it is preferable that the distance (gap) between the transfer mask 28 and the mounting surface of the substrate 24 be fixed and that, in other words, the back surface of the transfer mask 28 be parallel to the mounting surface of the substrate. If the gap between the transfer mask 28 and the

SUMMARY OF THE INVENTION

The thin plate mask associated with the present invention is arranged facing a substrate, in which a mask in which plurality of through-holes is formed for the purpose of dropping conductive balls onto a plurality of terminal areas, and slits are formed in the surface of the mask extending along the length direction and the width direction of the mask, inside the edge of the substrate when the mask is placed opposite the substrate, and outside the area in which the plurality of through-holes is formed. The conductive balls are solder balls or micro-balls in which a solder layer, etc., has been formed on the surface of a metal or resin core.

The semiconductor manufacturing device associated with the present invention includes a mask, a fixing means to affix the perimeter of the mask to a fixing surface, and a mounting means to mount the substrate on a mounting surface so that one surface of the substrate extends beyond the fixing surface, wherein the back surface of the mask is placed facing one surface of the substrate and the plurality of through-holes in the mask is aligned with the plurality of terminal areas on one surface of the substrate.

The semiconductor device manufacturing method of the present invention is a method in which conductive balls are connected to a plurality of terminal areas formed on one surface of a substrate, which method includes processes for preparing a mask, for mounting the substrate on a mounting surface so that one surface of the substrate is exposed, for affixing the perimeter of the mask so that the back surface of the mask faces one surface of the substrate and so that the plurality of terminal areas on the substrate are respectively aligned with the plurality of through-holes in the mask, and for dropping conductive balls from the plurality of through-holes in the mask and connecting them to the corresponding terminal areas.

The manufacturing method further includes a process for mounting a plurality of semiconductor chips on the other surface opposite one surface of the substrate, and a process for sealing the plurality of semiconductor chips. The manufacturing method further includes a process for reflow-soldering the metal terminals connected to the terminal areas on the substrate, and a singulation process for dicing the substrate into individual semiconductor chips.

BRIEF DESCRIPTION OF THE DRAWINGS

FIG. 3(a) is a plan view of the transfer mask associated with an embodiment example of the present invention and FIG. 3(b) is a cross section along line B-B thereof.

FIG. 6(a) and FIG. 6(b) are drawings to explain the operation when a warped substrate is being pressed down by a transfer mask associated with an embodiment of the present invention, wherein FIG. 6(a) is a side view of a micro-ball mounting device and FIG. 6(b) is an enlarged detail of area C.

FIG. 7 is a plan view that shows an example of another transfer mask associated with an embodiment example of the present invention.

FIG. 8(a), FIG. 8(b), and FIG. 8(c) are drawings that show another example of a transfer mask associated with an embodiment example of the present invention.

REFERENCE NUMERALS AND SYMBOLS AS SHOWN IN THE DRAWINGS

In the figures, 100 represents a substrate, 102 a semiconductor chip, 104*a*, 104*b*, 104*c*, and 104*d* blocks, 106 a bonding wire, 108 a terminal area, 110 a molded resin, 200 a transfer mask, 210 a metal layer, 220 a resin layer, 230, 232, 234, and 236 slits, 240 an area corresponding to one semiconductor chip, 242 a through-hole, 260 an opening, and 380 a micro-ball.

DESCRIPTION OF THE EMBODIMENTS

Forming slits in the mask surface according to the present invention gives the mask flexibility and relieves the tension and rigidity of the mask, making it possible for the mask and the substrate to be held close at a more constant distance than in the prior art, without variations in the gap. Thus, when the conductive balls are dropped from the through-holes in the mask, the conductive balls are positioned and connected accurately in the terminal areas on the substrate. As a result, connection defects and drop-outs in the conductive balls can be decreased, the yield of semiconductor devices can be improved, and their manufacturing cost can be decreased.

A preferred embodiment of the present invention will be described in detail below, with reference to the attached figures.

Figure 1:
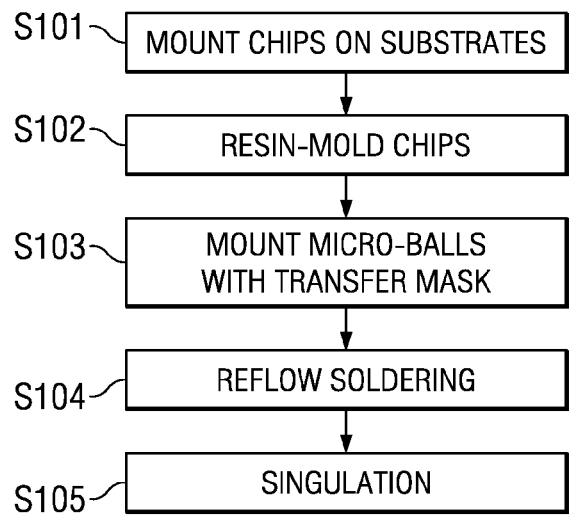
FIG. 1 shows the overall process flow of a manufacturing process for a semiconductor device associated with an embodiment example of the present invention.

FIG. 1 shows the overall process flow of a preferred manufacturing process for a semiconductor device associated with an embodiment example of the present invention. In this embodiment, a BGA package is used as an example of a surface-mount semiconductor device. First, semiconductor chips are mounted on a substrate (step S101), then the mounted semiconductor chips are resin-molded (step S102). Next, a transfer mask is used to mount micro-balls on the terminal areas (electrode lands) of the substrate (step S103), the micro-balls and terminal areas are connected by reflow soldering (step S104), and then singulation is performed to dice the substrate into individual semiconductor chips (step S105).

Figure 2A:
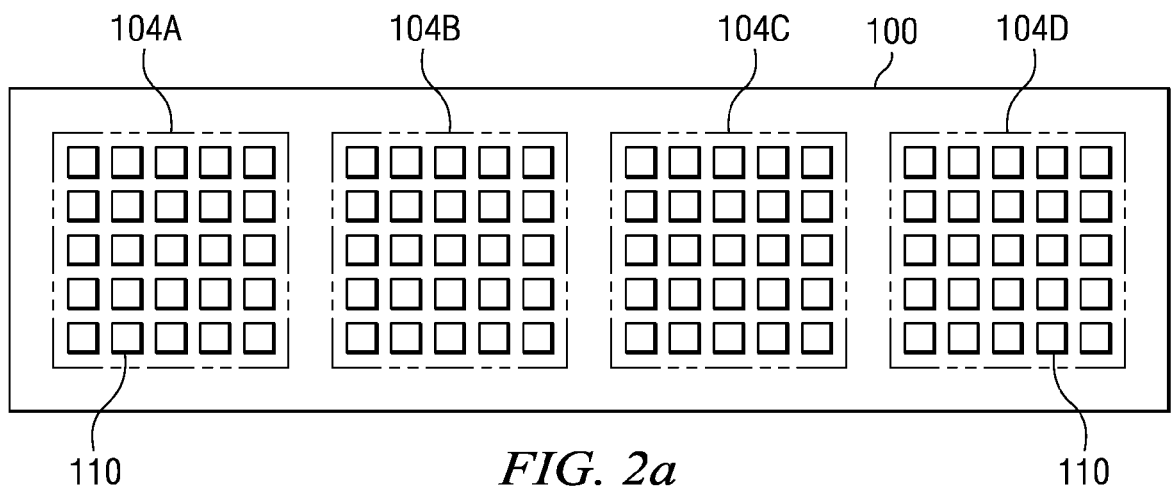
FIG. 2(a) is a plan view illustrating a substrate on which semiconductor chips have been mounted and FIG. 2(b) is a sectional drawing of one of the semiconductor chips mounted on the substrate.
Figure 2B:
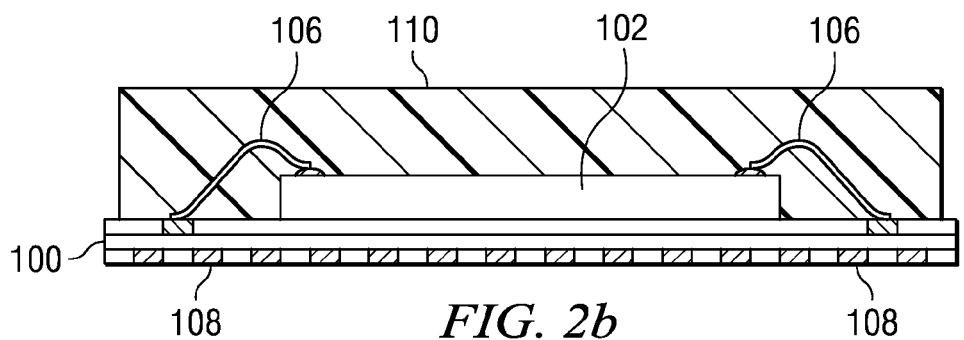

FIG. 2(a) is a plan view of a substrate on which semiconductor chips have been mounted and FIG. 2(b) is a drawing showing a sectional view of one of the semiconductor chips mounted on the substrate. The structure of the substrate 100 is not particularly limited, but a multilayered wiring substrate or film substrate in which insulating layers and wiring layers are laminated may be used. The outside dimensions of the substrate 100 are, e.g., approximately 230 mm in the length direction and approximately 62 mm in the width direction. Semiconductor chips 102 are mounted in a two-dimensional array on the surface of the substrate 100. For example, 5×5 semiconductor chips make up one block 104A, and such blocks 104B, 104C, 104D are arrayed in the length direction of the substrate 100.

One semiconductor chip 102 is affixed to the substrate 100 by means of an adhesive, such as die adhesive, as shown in FIG. 2(b), and electrodes formed on the surface of the semiconductor chip 102 are connected to the wiring patterns on the substrate 100 by bonding wires 106. Alternatively, the semiconductor chip 102 may also be flip-chip mounted, in which bump electrodes formed on its surface are placed face-down and connected to the wiring patterns on the substrate. The wiring patterns formed on the surface of the substrate 100 are connected via internal wiring to a plurality of terminal areas (shown in black in the figures) 108 that have been formed in an array on the back surface of the substrate 100. The terminal areas 108 provide areas where the micro-balls that constitute the external connection terminals for the BGA package are connected, as will be described below, and several tens to several hundreds of micro-balls may be connected per BGA package.

In addition, each individual semiconductor chip 102 on the substrate 100 is molded in resin 110. An example is shown in this embodiment where each of the semiconductor chips 102 is molded individually, but, e.g., each 5×5 block of semiconductor chips may also be molded as a batch. The height of the resin 110 from the surface of the substrate 100 in this example is approximately 450 μm, and the thickness of the substrate 100 is approximately 240 μm.

Figure 4:
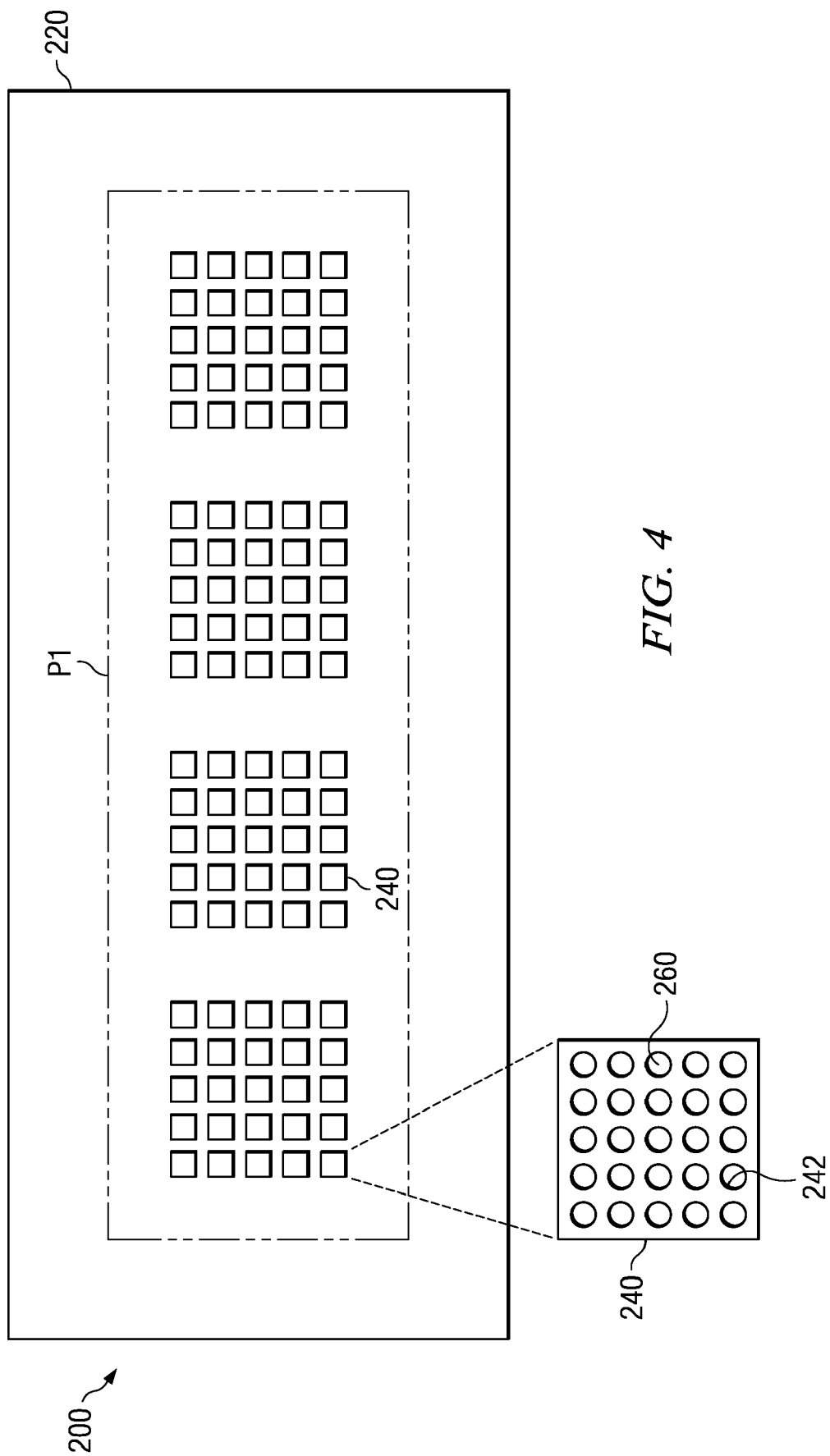
FIG. 4 is a back view of the transfer mask shown in FIG. 3.

Next, the transfer mask used in the micro-ball mounting device will be described. FIG. 3(*a*) is a plan view of the transfer mask in this embodiment example, FIG. 3(*b*) is a cross section through line B-B and FIG. 4 is a back view of the transfer mask. The transfer mask 200 has a rectangular shape that is larger than the substrate 100, being approximately 600 mm in its length direction and approximately 550 mm in its width direction. The transfer mask 200, as shown in FIG. 3(*b*), is constructed from a two-layer structure comprising a metal layer 210 made from stainless steel (SUS) or nickel alloy, etc., and a resin layer 220 formed on the bottom surface thereof from acrylic or epoxy, etc. The thickness of the metal layer 210 is approximately 140 μm, and the thickness of the resin layer 220 is approximately 60 μm. The metal layer 210 imparts a set amount of strength, i.e., tension, to the transfer mask. The resin layer 220 prevents the flux or solder paste, etc., formed in the terminal areas on the substrate from adhering to the metal layer 210. It is preferred that the thickness of the transfer mask 200 be approximately 1.1 times that of a micro-ball, or, from the viewpoint of preventing lateral displacement of the micro-balls, it is preferred that the thickness of the resin layer 220 of the transfer mask 200 be approximately ⅓ that of a micro-ball 270. In the case of the example in FIG. 3, since the transfer mask 200 is approximately 200 μm thick, it is preferable that the diameter of the micro-balls be approximately 180 μm.

As shown in FIG. 3(*a*), two parallel slits 230, 232, extending in the length direction from one side face to the other opposite side face, and two parallel slits 234, 236, extending in the width direction from one side face to the other opposite side face, are formed in the surface of the transfer mask 200. The slits 230, 232, 234, 236 are grooves that have been formed in the surface of the metal layer 210 by, e.g., laser fabrication, at a depth of approximately 50 μm.

The substrate edge when the transfer mask 200 is mounted in the micro-ball mounting device and the transfer mask 200 is facing the substrate 100 is represented by P1, and the outer edge of the semiconductor chip mounted on the substrate, here the outer edge of each block 104A~104B, is represented by P2. The positions at which the slits 230~236 are formed are positions that are inside the edge P1 of the substrate 100, and positions that are outside the outer edge P2 of the blocks on the substrate 100.

Round through-holes are formed in the transfer mask 200 in the same pattern as the pattern of the terminal areas 108 on each semiconductor chip. The diameter of each through-hole is somewhat greater than the diameter of a micro-ball that will be dropped into it. For the sake of convenience, a pattern is shown in FIG. 3(*a*) of the through-holes 242 that are formed in the area 240 corresponding to one semiconductor chip in block 104A. The terminal areas 108 of the semiconductor chip in this example are in a 5×5 pattern, and a 5×5 pattern of through-holes is formed in the transfer mask corresponding to them. Furthermore, other through-hole patterns are omitted from this figure.

A rectangular etched opening 260 is formed in the resin layer 220 that constitutes the back surface of the transfer mask 200 to expose an area 240 that corresponds to each semiconductor chip on the substrate. This opening 260 is formed by etching, whereby through-holes 242 penetrate the metal layer 210 of the transfer mask 200. Further, for the sake of convenience, an opening 260 is shown in FIG. 4 that has been formed in the area 240 corresponding to one semiconductor chip in block 104A; and all other openings have been omitted from this figure. In addition, the area in which the resin layer 220 is formed is indicated by hatch marks to make it easy to understand.

Figure 5:
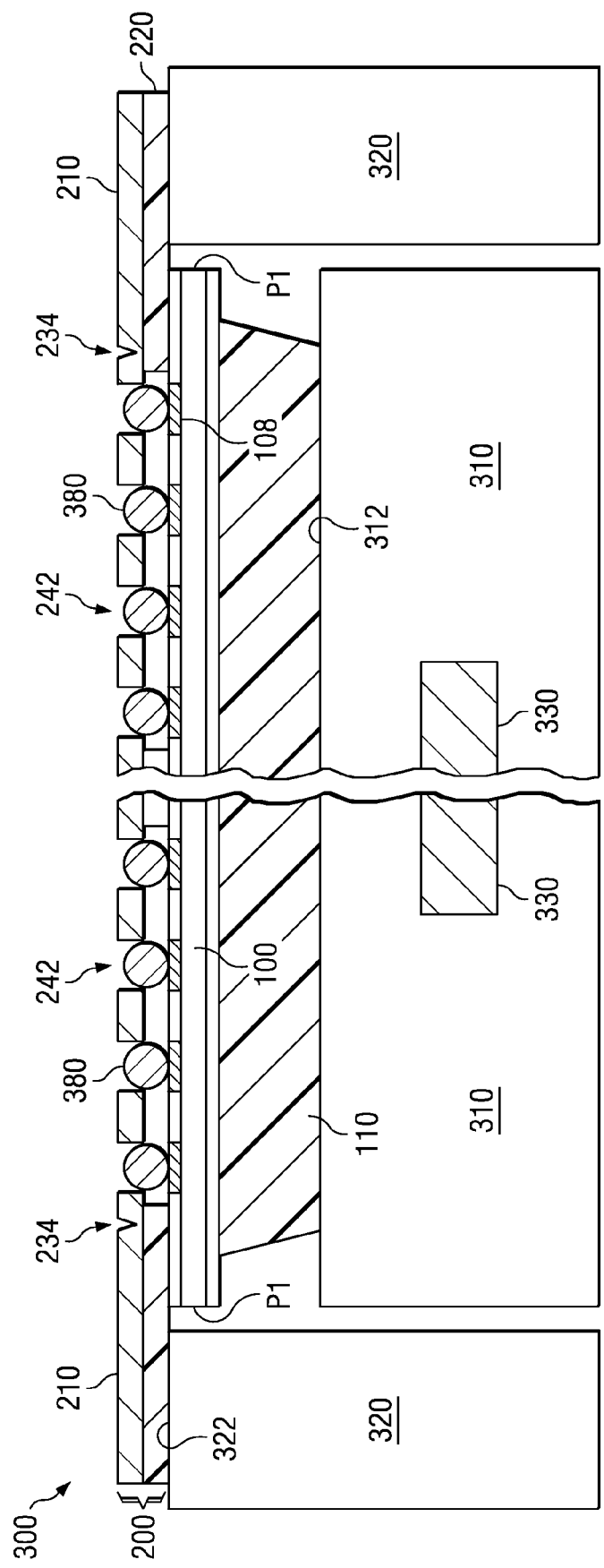
FIG. 5 is a sectional drawing that shows the general structure of a micro-ball mounting device associated with an embodiment example of the present invention.

Next, the operation of the micro-ball mounting device that uses a transfer mask will be described. FIG. 5 is a sectional drawing that shows the general structure of a micro-ball mounting device, but one should bear in mind that a semiconductor chip on the substrate has been represented enlarged to make the description easy to understand.

The micro-ball mounting device 300 includes a stage 310 and backup blocks 320 on either side of the stage 310. In addition, there is a magnet 330 in the interior of the stage 310 to draw the transfer mask 200 toward the stage. The substrate 100 is mounted with the molded resin 110 on the mounting surface 312 of the stage 310 so that the terminal areas 108 are open to the top. At this time, the surface on which the terminal areas 108 are formed on the substrate 100 (hereinafter, referred to as the micro-ball mounting surface) is somewhat higher than the fixing surface 322 of the backup stages 320.

Next, the transfer mask 200 is mounted onto the micro-ball mounting device. The transfer mask 200 is registered on the substrate, and the perimeter of the transfer mask 200 is affixed to the fixing surface 322 of the backup blocks 320. One method of fixing is by vacuum suction. Since the micro-ball mounting surface of the substrate 100 extends beyond the fixing surface 322, the resin layer 220 of the transfer mask 200 presses on a specified area of the micro-ball mounting surface with. The slits 230, 232, 234, 236 formed in the metal layer 210 of the transfer mask 200 are positioned inside the substrate edges P1 and outside the area in which the micro-balls will be mounted. These slits impart flexibility to the transfer mask 200.

Furthermore, a magnet 330 attracts the metal layer 210 at the center of the transfer mask 200, whose perimeter has been affixed. Therefore, the micro-ball mounting surface is pressed toward the stage 310 by the transfer mask 200, and the gap between the transfer mask 200 and the micro-ball mounting surface is made nearly constant. In this way, when the transfer mask 200 and the substrate 100 are in a registered state, the through-holes 242 formed in the transfer mask 200 are aligned with the terminal areas 108 on the substrate 100.

Figure 6A:
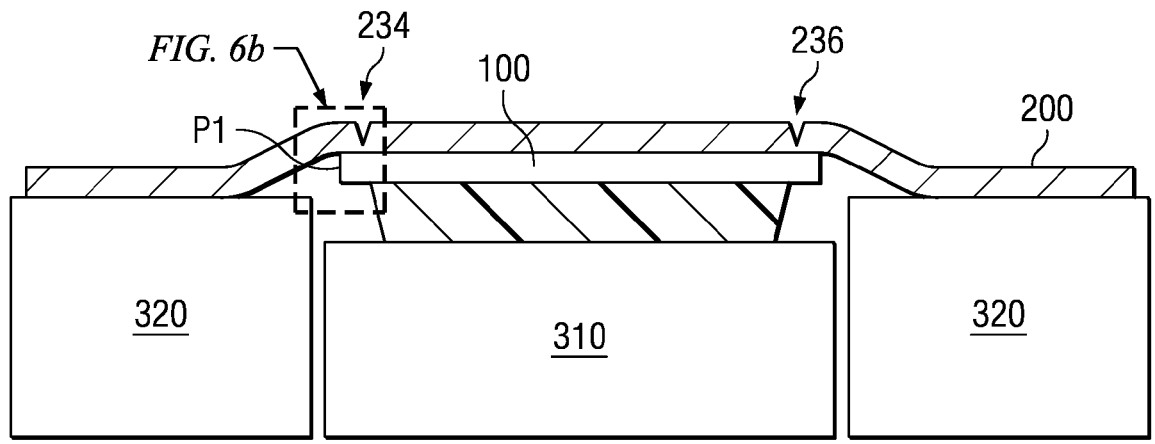
Figure 6B:
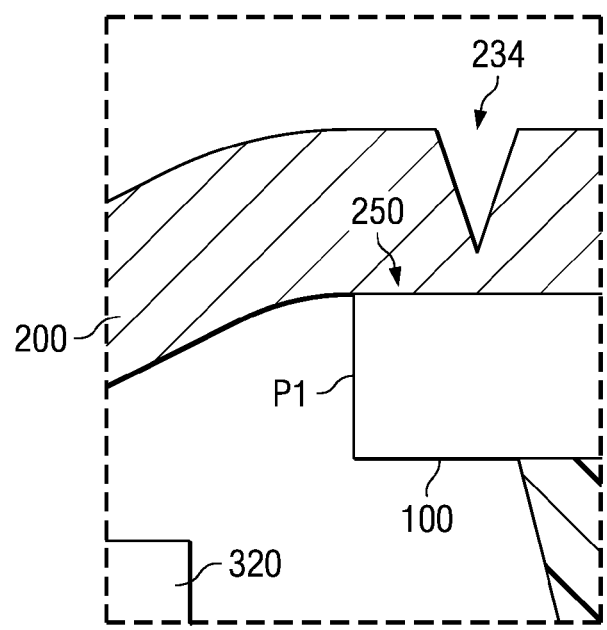
Figure 9A:
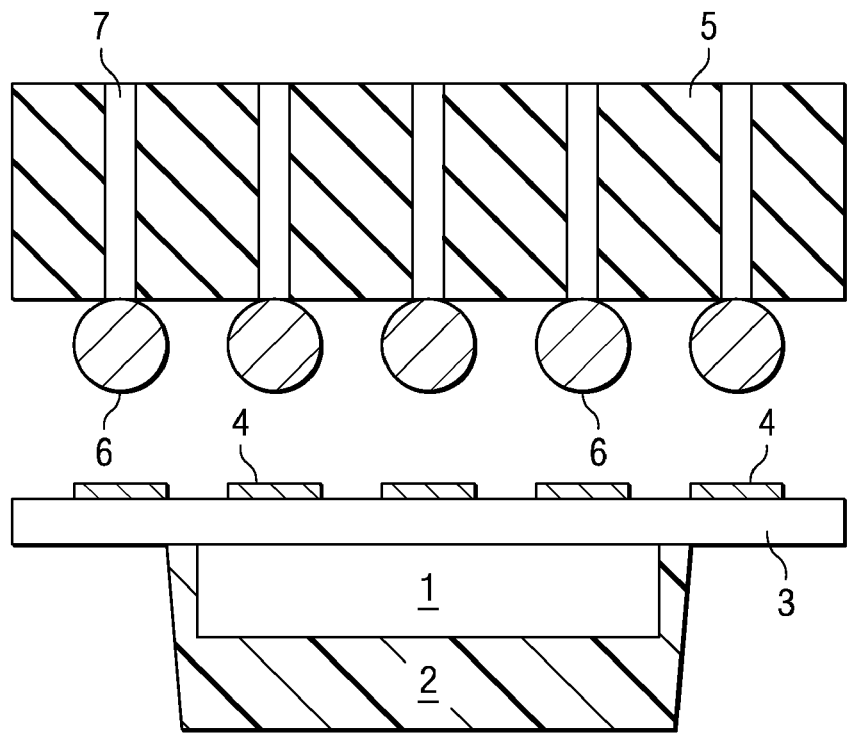
FIG. 9(a) and FIG. 9(b) are drawings to explain a past micro-ball mounting method, wherein (a) illustrates a method that employs a new suction head and (b) illustrates a method that employs a transfer mask.
Figure 9B:
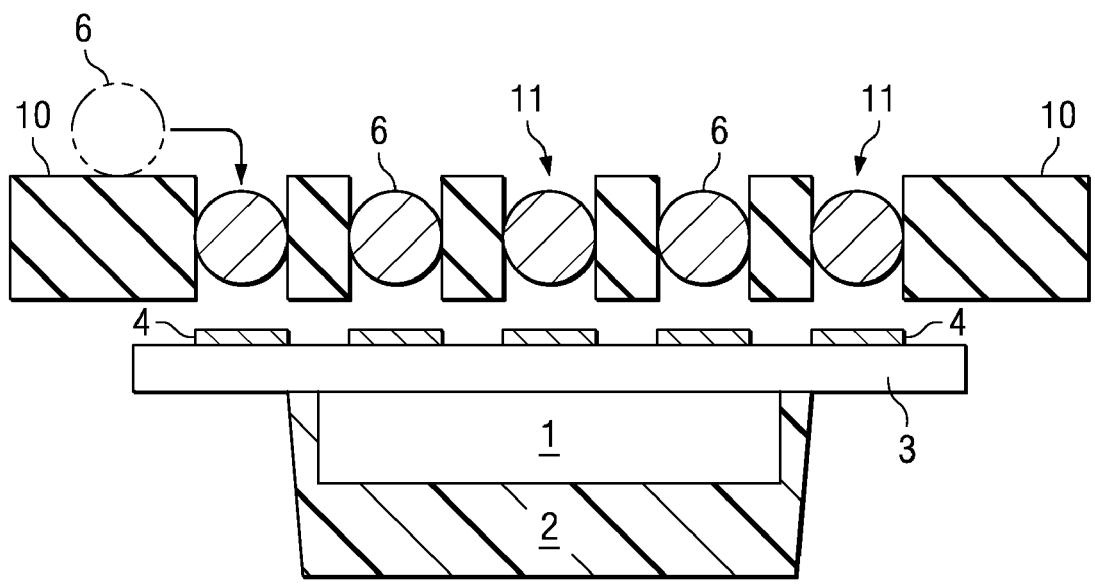
Figure 10A:
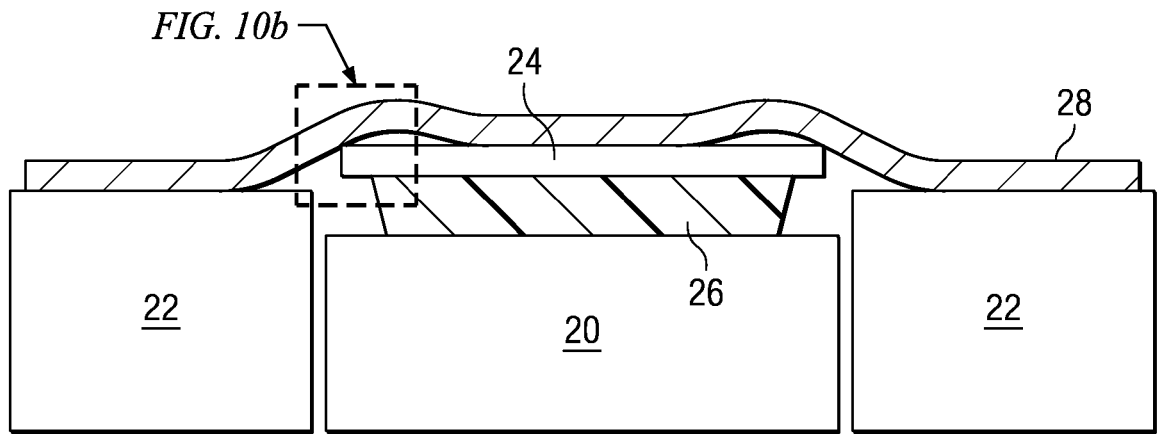
FIGS. 10(a) and 10(b) are drawings that illustrates the problems with micro-ball mounting methods of the prior art that use transfer masks.
Figure 10B:
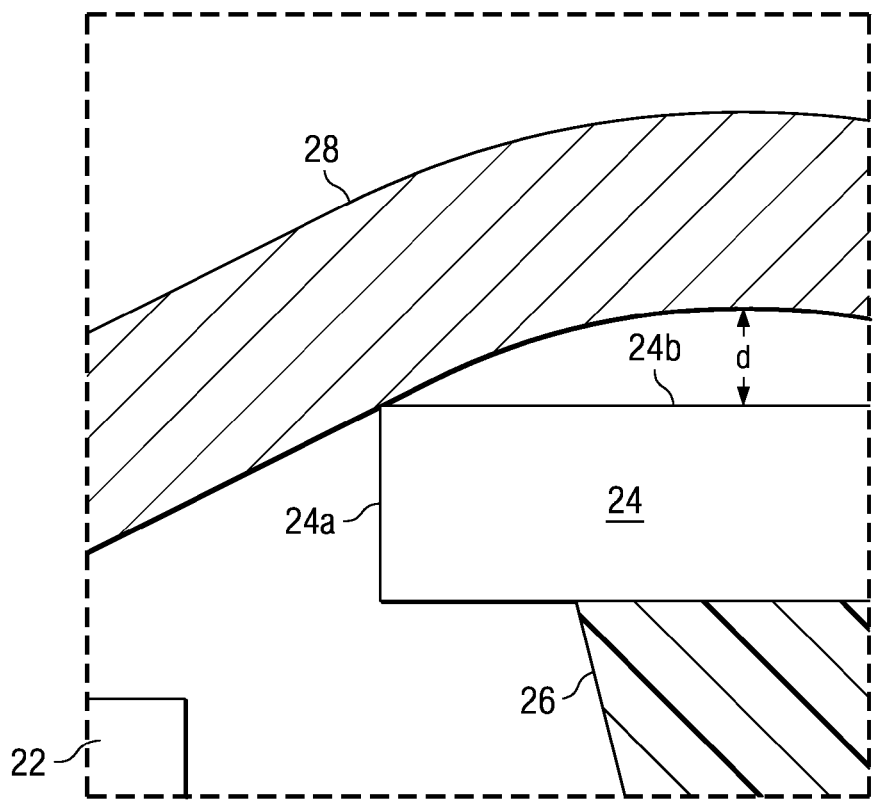

If the substrate warps due to thermal contraction, etc., of the molded resin formed on the substrate 100, the substrate edge P1 inclines upwardly. The edge of the substrate P1 comes in contact with the resin layer 220 of the transfer mask 200 and would tend to raise the perimeter of the transfer mask 200 upward, as shown in FIG. 6, but since slits 230, 232, 234, 236 are formed in the surface of the transfer mask 200 in the length direction and the width direction of the substrate, the rigidity of the transfer mask 200 is decreased (flexibility is increased), the perimeter of the transfer mask 200 is made to conform to the substrate, and upward warping of the substrate edge P1 is greatly curtailed. Consequently, the transfer mask 200 and the micro-ball mounting surface of the substrate can be brought together with a more nearly uniform gap than in the prior art.

Referring again to FIG. 5, when the micro-balls 380 are supplied onto the transfer mask 200 from a supply device, the micro-balls 380 are dropped into the through-holes 242 by a discharge element. Since the gap between the transfer mask and the micro-ball mounting surface has been optimized, the micro-balls 380 are positioned accurately on the terminal areas 108 on the substrate 100 and mounted accurately on the terminal areas 108. It is preferable to form flux or solder paste in the terminal areas 108.

Next, the substrate with the micro-balls mounted is reflow-soldered, whereby the solder formed on the micro-ball surface is melted and connected to the terminal areas 108. Next, the substrate is diced with a blade into individual semiconductor chips. Thus, BGA packages are obtained with micro-balls 380 mounted.

Next, another example of a transfer mask structure associated with an embodiment of the present invention will be described. FIG. 7 is a plan view that shows another example of a transfer mask. Rather than slits extending from one side surface to the other, the transfer mask 400 may have a closed rectangular slit 410 that extends in the length direction and width direction. Furthermore, portions at the intersections of the length direction and the width direction preferably may be curved to relieve the tension in the transfer mask. Furthermore, the slits may have shapes other than that described above, and preferably may be formed to be linearly symmetric about the centerline of the substrate when the transfer mask is facing the substrate. In this way, warping of the substrate is corrected uniformly and it becomes difficult for variations to occur in the gap between the transfer mask and the substrate.

Furthermore, the shape of the slit 234 formed in the metal layer 210 may be a concave depression 422, as shown in FIG. 8(a). Furthermore, a slit 424 may be formed in addition to slit 234 to form a plurality of slits, as shown in FIG. 8(b). Furthermore, in cases in which a plurality of slits is formed, a slit 426 with a shallower depth than that of slit 234 may be formed, as shown in FIG. 8(c).

Preferred embodiments of the present invention have been explained, but the present invention is not limited to said embodiments, and a variety of modifications and alterations are possible within the scope of the essence of the invention disclosed in the patent claims.

An example of a BGA package was given in the above embodiments, but the present invention can also be applied to other surface-mount semiconductor devices, such as CSP packages, etc. In addition, an example of a two-layered transfer mask with a metal layer and a resin layer was shown in the above embodiment, but the transfer mask may also have a single-layer structure, or even a multilayered structure with 3 or more layers. In addition, metals, plastics, and ceramics, etc., can be used as the materials that constitute the transfer mask. Furthermore, the semiconductor chips mounted on the substrate may be sealed, in addition to molding by transfer molding, by potting, etc.

The transfer mask of the present invention can be utilized in semiconductor manufacturing devices that manufacture surface-mount semiconductor devices, especially in mounting devices that mount micro-balls.

The invention claimed is:

1. A mask comprising a metal layer and a resin layer, a plurality of blocks of two dimensional arrays of through-holes, and slits on the surface of the mask extending along the length direction and the width direction of the mask and partially through the metal layer portion of the mask, the slits disposed between the edges of a substrate when the mask is placed opposite the substrate and the area of the arrays in which the plurality of through-holes is formed.

2. The mask of claim 1, in which the slits are formed with linear symmetry about a centerline of the substrate when the mask is aligned to the substrate.

3. The mask of claim 1, in which the slits are curved at the intersections between the slits extending along the length direction and the width direction.

4. An apparatus including the mask disclosed in claim 1, further comprising a fixing means to affix a peripheral portion of the mask to a fixing surface, and a mounting means to mount a substrate on a mounting surface so that a surface of the substrate extends beyond the fixing surface, and the plurality of through-holes in the mask are aligned to a plurality of terminal areas on a surface of the substrate.

5. The apparatus of claim 4, further comprising an urging means that urges the area of the mask where the plurality of through-holes is formed toward the mounting surface.

6. The apparatus of claim 5, in which the urging means includes a magnet.

7. The apparatus of claim 4, further comprising resin to seal a semiconductor chip on an opposite surface of the substrate, and said resin touches the mounting surface.

8. The apparatus of claim 7, wherein a plurality of molded resin areas is formed on the opposite surface of the substrate.

9. The apparatus of claim 5, further comprising a means to supply the conductive balls to the mask surface to be connected via the through-holes in the mask to a plurality of terminal areas formed on one surface of the substrate.

10. A semiconductor device manufacturing method for connecting conductive balls to a plurality of terminal areas on a surface of a substrate comprising:
    preparing a mask of claim 1;
    mounting the substrate onto a mounting surface so that one surface of the substrate is exposed;
    affixing a peripheral portion of the mask to a back surface so that the mask faces one surface of the substrate;
    aligning the plurality of terminal areas on the substrate with the plurality of through-holes in the mask passing conductive balls from the plurality of through-holes in the mask; and
    connecting the conductive balls to the corresponding terminal areas.

11. The manufacturing method of claim 10, further comprising a step of mounting a plurality of semiconductor chips onto the other opposite surface of the substrate, and a step of sealing the plurality of semiconductor chips with resin.

12. The manufacturing method of claim 10, further comprising a step of reflowing the conductive balls on the metal terminals to connect the solder balls to the terminal areas.

13. The manufacturing method of claim 10, further including a step of dicing the substrate into individual semiconductor chips.

14. The manufacturing method of claim 10, wherein the conductive balls include a solder layer on their surface.

* * * * *